(12) United States Patent
Huang

(10) Patent No.: US 8,901,596 B2
(45) Date of Patent: Dec. 2, 2014

(54) LIGHTING DEVICE AND METHOD FOR MANUFACTURING THE SAME

(75) Inventor: Shih-Chung Huang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 736 days.

(21) Appl. No.: 13/167,288

(22) Filed: Jun. 23, 2011

(65) Prior Publication Data

US 2012/0119248 A1 May 17, 2012

(30) Foreign Application Priority Data

Nov. 15, 2010 (CN) .......................... 2010 1 0547357

(51) Int. Cl.
| | |
|---|---|
| H01L 33/08 | (2010.01) |
| H01L 33/48 | (2010.01) |
| H01L 33/58 | (2010.01) |
| H01L 25/075 | (2006.01) |

(52) U.S. Cl.
CPC ....... *H01L 33/486* (2013.01); *H01L 2933/0033* (2013.01); *H01L 33/58* (2013.01); *H01L 25/0753* (2013.01); *H01L 2224/45144* (2013.01); *H01L 2224/48091* (2013.01)

USPC .................. 257/99; 257/E33.058; 438/26

(58) Field of Classification Search
CPC ............................... H01L 33/08; H01L 23/48
USPC ................... 257/99, E33.058; 438/26
See application file for complete search history.

(56) References Cited

U.S. PATENT DOCUMENTS

| 2008/0023721 A1* | 1/2008 | Lee et al. ..................... 257/99 |
| 2009/0315061 A1* | 12/2009 | Andrews ....................... 257/99 |
| 2010/0067248 A1* | 3/2010 | Frey et al. ................... 362/538 |

* cited by examiner

*Primary Examiner* — Marc Armand
(74) *Attorney, Agent, or Firm* — Rosenberg, Klein & Lee

(57) ABSTRACT

A method for manufacturing a lighting device includes the steps of: preparing a substrate having at least one lighting chip, a frame for surrounding the lighting chip, and a cover body for covering one side of the frame; bonding the frame and the substrate so that the lighting chip is located within a region surrounded by the frame; and bonding the cover body and the frame so that the cover body and the frame cooperatively define a receptacle to cover the lighting chip. A bonding force between the cover body and the frame is configured to be smaller than a bonding force between the frame and the substrate so that when the cover body is separated from the frame, the bonding between the frame and the substrate is not destroyed.

23 Claims, 5 Drawing Sheets

US 8,901,596 B2

LIGHTING DEVICE AND METHOD FOR MANUFACTURING THE SAME

CROSS-REFERENCE TO RELATED APPLICATION

This application claims priority of Chinese Application No. 201010547357.3, filed on Nov. 15, 2010.

BACKGROUND OF THE INVENTION

1. Field of the Invention

This invention relates to a lighting device, and more particularly to alighting device having a removable cover body and a method for manufacturing the same.

2. Description of the Related Art

Following the evolution of technology, many electronic products progress toward miniaturization and lightweight to facilitate hand carry and use of the same. A microprojector is also a new generation miniaturized portable product. Since the light-emitting diode (LED) is small, and has an energy-saving function and a long service life, it is suitable for use in a light source of the microprojector.

A light source system of the microprojector is an etendue-limited system. Hence, the smaller the etendue of a light source, the higher the use efficiency of light. Further, the etendue is related to the refractive index of a medium which the light rays pass through. The lower the refractive index of the medium, the smaller the etendue. Usually, the refractive index of air is smaller than that of a transparent material, such as glass or optical grade resin. Hence, the etendue of light source which directly emits light to transmit to air is relatively small.

Thus, to develop a lighting device having a small etendue is the current trend.

SUMMARY OF THE INVENTION

Therefore, an object of the present invention is to provide a method for manufacturing a lighting device which has a removable cover body to protect a chip prior to removal of the cover body and for a light source to have a small etendue after removal of the cover body.

Another object of the present invention is to provide a lighting device having a removable cover body.

According to one aspect of this invention, a method for manufacturing a lighting device comprises the steps of: preparing a substrate having at least one lighting chip, a frame for surrounding the lighting chip, and a cover body for covering one side of the frame; bonding the frame and the substrate so that the lighting chip is located within a region surrounded by the frame; and bonding the cover body and the frame so that the cover body and the frame cooperatively define a receptacle to cover the lighting chip. A bonding force between the cover body and the frame is configured to be smaller than a bonding force between the frame and the substrate.

According to another aspect of this invention, alighting device comprises a substrate, at least one lighting chip mounted on the substrate, a frame disposed on the substrate and surrounding the lighting chip, and a cover body. The frame has opposite top and bottom surfaces. The bottom surface is bonded to the substrate. The cover body is bonded removably to the top surface of the frame, and cooperates with the frame to cover the lighting chip.

The efficiency of the present invention resides in the fact that through the cover body which can be bonded removably to the frame, the cover body and the frame can be used to protect the lighting chip and its conducting wires. Further, after the cover body is removed from a subsequent application (assembled on the microprojector) of the light source system, the frame can be used to protect the conducting wires from being contacted, and the light source system can have a small Etendue.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
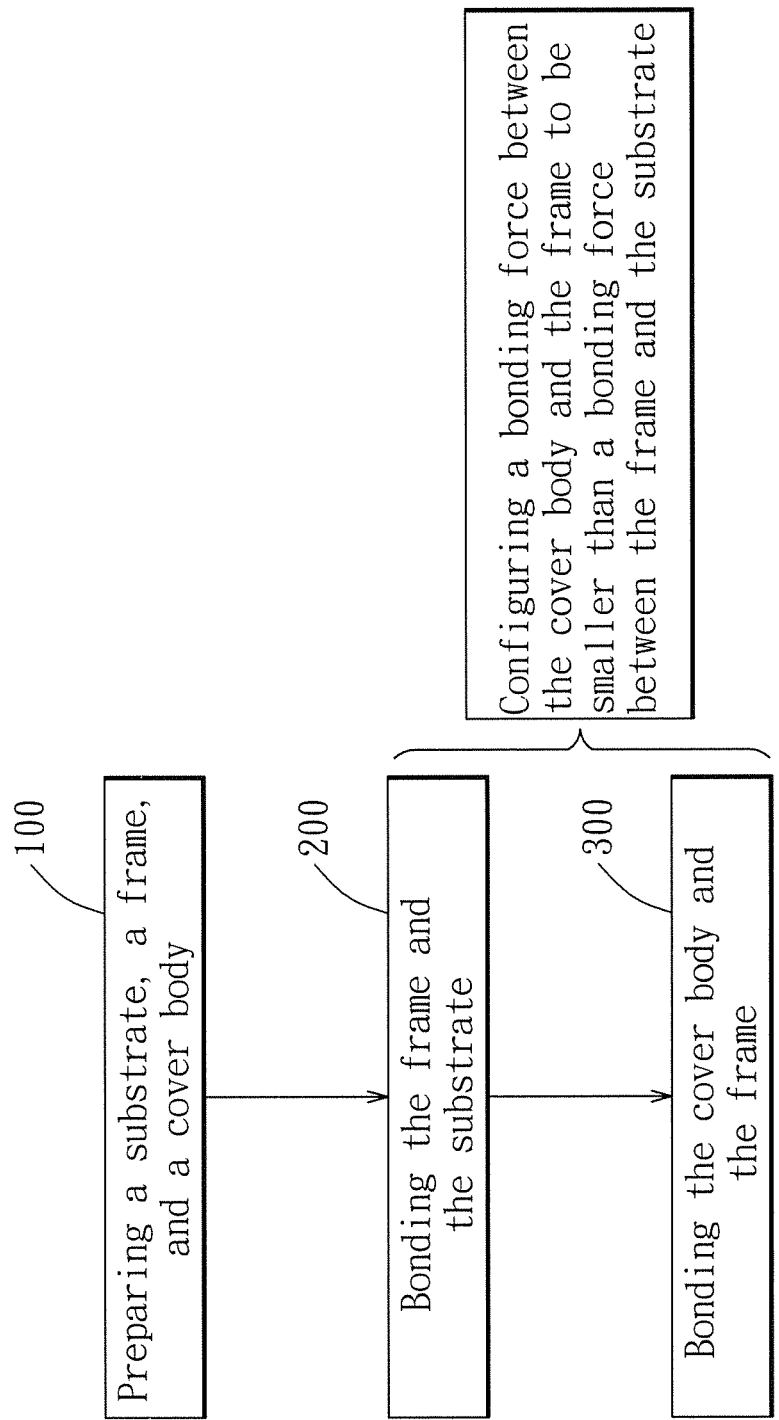
FIG. 1 is a block diagram of a method for manufacturing a lighting device of the present invention.

The above-mentioned and other technical contents, features, and effects of this invention will be clearly presented from the following detailed description of two preferred embodiments in coordination with the reference drawings.

Before this invention is described in detail, it should be noted that, in the following description, similar elements are designated by the same reference numerals.

Referring to FIG. 1, a method for manufacturing a lighting device of the present invention includes steps 100, 200, and 300.

In step 100, the following components are prepared: a substrate having at least one lighting chip, a frame for surrounding the lighting chip, and a cover body for covering one side of the frame.

In step 200, the frame and the substrate are bonded such that the lighting chip is within a region surrounded by the frame.

In step 300, the cover body and the frame are bonded so that the cover body and the frame cooperatively define a receptacle for covering the lighting chip.

To prevent the bonding between the frame and the substrate from being destroyed when the cover body is separated from the frame, a bonding force between the cover body and the frame must be configured to be smaller than a bonding force between the frame and the substrate.

Further, the bonding force between the cover body and the frame is defined as a first bonding force (F1), and the bonding force between the frame and the substrate is defined as a second bonding force (F2), the correlation between the first and second bonding forces (F1, F2) can be expressed as:

$$25\% < \left(\frac{|F1 - F2|}{F2} \times 100\%\right) < 100\%$$

That is, the percentage of the absolute value of the difference between the first and second bonding forces (F1, F2) based on the second bonding force (F2) is preferably in the range of 25% to 100%.

More preferably, the percentage of the absolute value of the difference between the first and second bonding forces (F1, F2) based on the second bonding force (F2) is in the range of 40% to 90%. The first bonding force (F1) is preferably not smaller than 5 kgf/cm².

Thus, the cover body and the frame have a sufficient bonding force (first bonding force) to prevent the cover body from falling off in the presence of a slight impact or vibration. Further, when the cover body is separated from the frame, the frame and the substrate also have a sufficient bonding force (second bonding force) to overcome an external force for separating the cover body from the frame, so that the bonding between the frame and the substrate cannot be destroyed.

Below two preferred embodiments can further explain the lighting device of the present invention and the method for manufacturing the same.

Figure 2:
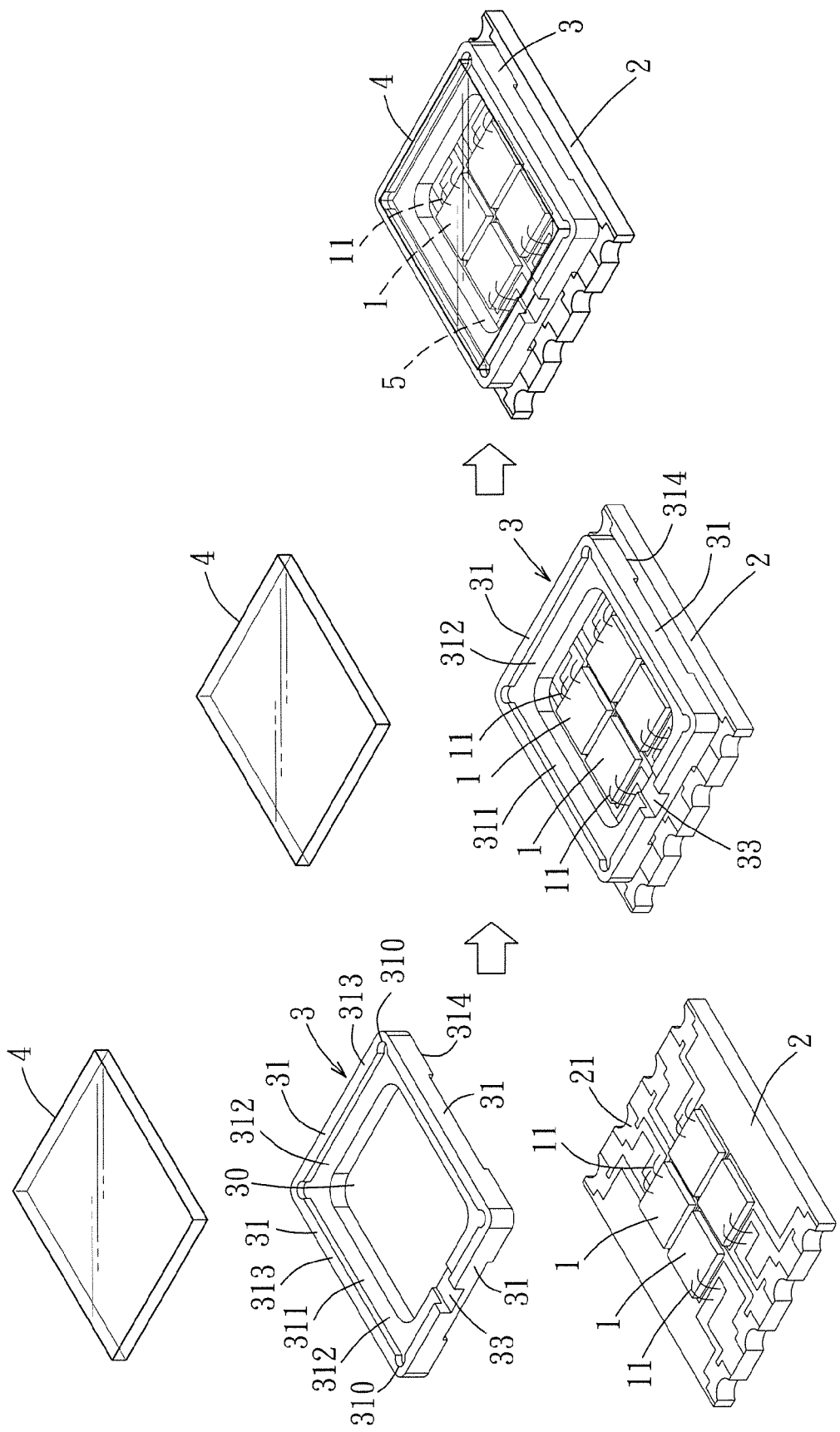
FIG. 2 is a flow diagram, illustrating the steps involved in the method for manufacturing the lighting device according to a first preferred embodiment of the present invention.

Referring to FIG. 2, a first preferred embodiment of the lighting device 10 according to the present invention comprises a substrate 2, a plurality of lighting chips 1 mounted on the substrate 2, a frame 3 disposed on the substrate 2 and surrounding the lighting chips 1, and a cover body 4 bonded removably to the frame 3 and cooperating with the frame 3 to define a receptacle 5 for covering the lighting chips 1. Alternatively, only one lighting chip 1 may be mounted on the substrate 2. In this embodiment, the lighting chip 1 can be an LED chip, the substrate 2 has a circuit pattern 21, and is mounted with four lighting chips 1. The lighting chips 1 and the circuit pattern 21 are connected electrically through conducting wires 11 (generally called gold wires). The frame 3 defines a frame opening 30, and includes two pairs of opposite frame sections 31 cooperating with each other to define the frame opening 30. Each frame section 31 has opposite top and bottom surfaces 312, 314, and a flange 313 projecting upward from the top surface 312 thereof. The flanges 313 and the top surfaces 312 of the frame sections 31 cooperatively define a limiting groove 311 for receiving and positioning the cover body 4 on the frame 3. Each frame section 31 further has an inner side facing the frame opening 30, and an outer side opposite to the inner side. Alternatively, the frame may have a circular shape. In this case, there is only one frame section that defines a circular frame opening.

The cover body 4 is bonded to the top surfaces 312 of the frame sections 31. The substrate 2 is bonded to the bottom surfaces 314 of the frame sections 31. The limiting groove 311 has four rounded corners 310 each extending into a junction of the flanges 313 of each two adjacent frame sections 31. The rounded corners 310 facilitate disposal of four corners of the cover body 4 when the cover body 4 is bonded to the frame 3, thereby preventing damage to the frame 3 due to impact or rubbing of the corners of the cover body 4 with the frame 3. A notch 33 is formed on the frame 3, and is indented downward from the top surface 312 and the flange 313 of one of the frame sections 31 for passage of air therethrough or to facilitate removal of the cover body 4 from the frame 3 in the subsequent application. Although the shape of the frame 3 in this embodiment is rectangular, in an alternative embodiment, it may have other shapes. Suitable materials for making the frame 3 may be porcelain, glass, metal, or plastic. Plastic materials may bepolyphthalamide (PPA), liquid crystalplastic (LOP), etc. The cover body 4 may be made of glass or optical grade resin. Although the cover body 4 in this embodiment is a flat plate body, in an alternative embodiment, it may be a cup-shaped body or a lens body.

Figure 3:
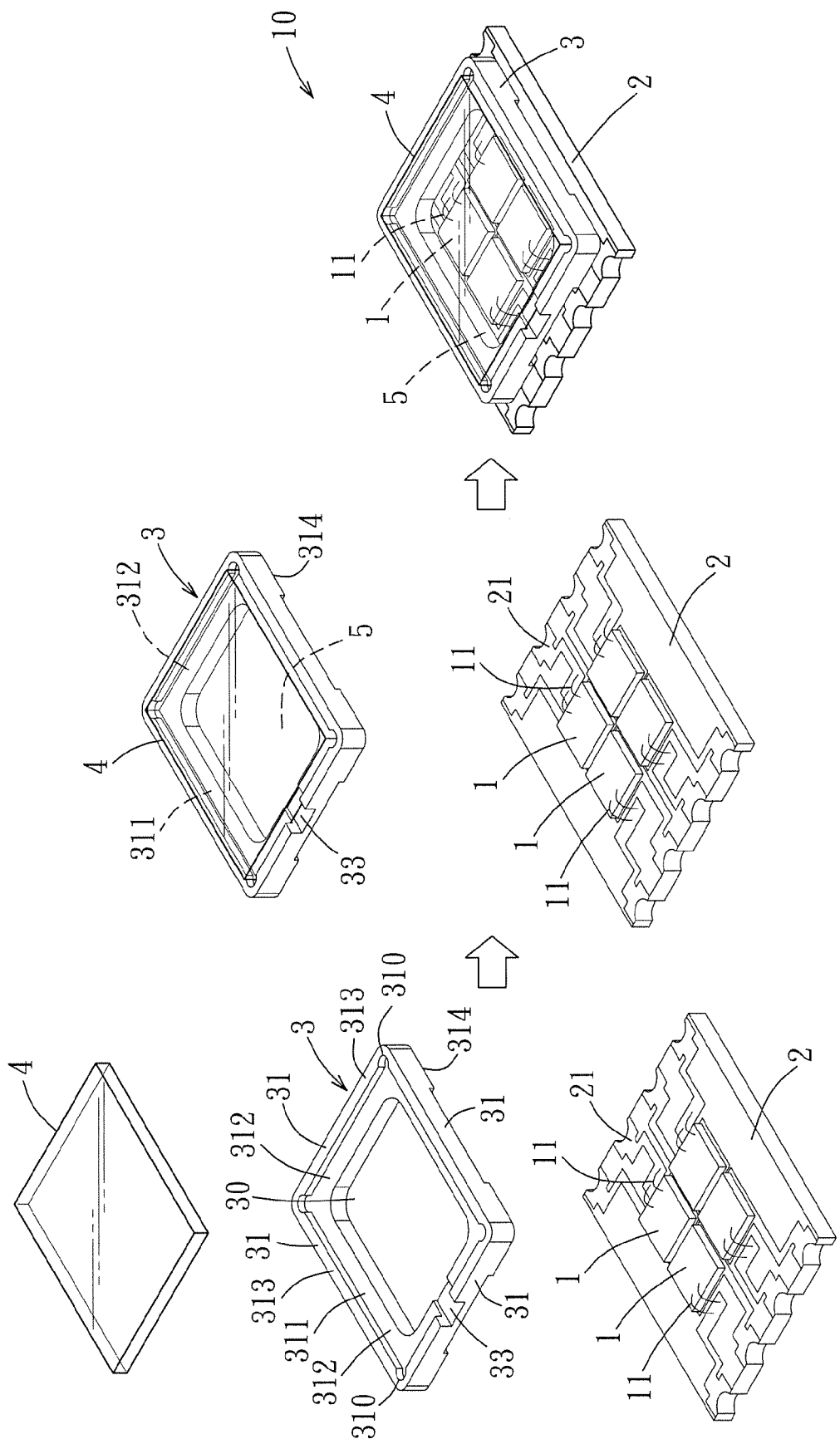
FIG. 3 is a flow diagram, illustrating alternative steps involved in the method for manufacturing the lighting device of the first preferred embodiment.

The method for manufacturing the lighting device 10 according to the first preferred embodiment, as shown in FIG. 2, includes the steps of boding firstly the frame 3 and the substrate 2, after which the cover body 4 and the frame 3 are bonded. Alternatively, as shown in FIG. 3, the cover body 4 and the frame 3 are bonded firstly, after which the frame 3 and the substrate 2 are bonded. Hence, the sequence of bonding the frame 3 to the substrate 2 or to the cover body 4 is not limited. Further, to facilitate description of the method of the present invention, only one lighting device 10 will be described herein. In actual production, the substrate 2 shown in FIGS. 2 and 3 is only a single unit of a large panel. That is, the large panel is made up of a plurality of the single units as the substrate 2. A plurality of the lighting devices 10 may be simultaneously completed on the large panel, after which the large panel is cut to form the respective lighting devices 10.

The frame 3 and the substrate 2 may be bonded through a soldering or adhesive bonding method. The actual method for bonding the frame 3 and the substrate 2 depend on the materials of the frame 3 and the substrate 2. Solder materials suitable for the soldering method are tin solder, silver glue, copper glue, and the like. Adhesive materials suitable for the adhesive bonding method are epoxy, silicone, cyanoacrylate, chloroprene rubber, polyvinyl chloride, polychloroprene, polytetrafluoroethene, and the like.

The cover body 4 and the frame 3 may also be bonded through a soldering or adhesive bonding method. Suitable soldering materials are similar to that described above. Suitable adhesive materials are epoxy, acrylic glue, silicone, polyurethane (PU), polyvinyl butyral (PVB), rubber, polyester, polyether, polyethylene, and the like.

To conform to the aforesaid correlation between the first and second bonding forces (F1, F2), the first bonding force (F1) can be controlled. The control method includes: I. Controlling a bonding area of the cover body 4 and the frame 3 so that the bonding area of the cover body 4 and the frame 3 is smaller than a bonding area of the frame 3 and the substrate 2; and II. Controlling an adhesive force of the adhesive material for adhering the cover body 4 and the frame 3. Concrete descriptions are given below.

I. Method for Controlling a Bonding Area

A. For example, surface roughening the top surfaces 312 of the frame sections 31 or forming the top surfaces 312 with a convex-concave structure so as to reduce contact area between the frame 3 and the cover body 4. An example to form the convex-concave structure is to provide protrusions on four corners of the frame 3 or spaced-apart protruding pins on the top surfaces 312 of the frame sections 31 so that the cover body 4 is in contact with the protruded portions only, thereby minimizing the contact area between the frame 3 and the cover body 4. Further, in this embodiment, since the frame 3 has the limiting groove 311, the cover body 4 is only in contact with a groove bottom wall (i.e., the top surfaces 312 of the frame sections 31) of the limiting groove 311, so that contact area between the frame 3 and the cover body 4 is also minimized. In comparison with the bottom surfaces 314 of the frame sections 31 which are in full contact with the substrate 2, the top surfaces 312 are either roughened or formed with the convex-concave structure or cooperate with the flanges 313 to define the limiting groove 311, so that the contact area between the cover body 4 and the frame 3 is smaller than the contact area between the frame 3 and the substrate 2. When the contact area between the cover body 4 and the frame 3 is small, the bonding area and the bonding force (i.e., the first bonding force, F1) between the cover body 4 and the frame 3 are also small.

B. If the contact area between the top surfaces 312 of the frame sections 31 and the cover body 4 is similar to the contact area between the bottom surfaces 314 of the frame sections 31 and the substrate 2, a coating area of the adhesive material is controlled to control the bonding area. For example, the top surfaces 312 of the frame sections 31 are coated partially with the adhesive material, while the bottom surfaces 314 of the frame sections 31 are coated completely with the adhesive material. As such, the bonding area of the top surfaces 312 and the cover body 4 is smaller than the bonding area of the bottom surfaces 314 and the substrate 2. Hence, different bonding forces can be produced.

II. Method for Controlling an Adhesive Force of an Adhesive Material for Adhering the Cover Body 4 and the Frame 3

A. Selecting a Suitable Viscosity of the Adhesive Material

Since different types of adhesive materials have different viscosities, different adhesives may be used for bonding the cover body 4 to the frame 3 or the frame 3 to the substrate 2. The viscosity of the adhesive material used for bonding the cover body 4 and the frame 3 must be inferior to the viscosity of the adhesive material used for bonding the frame 3 and the substrate 2.

Figure 4:
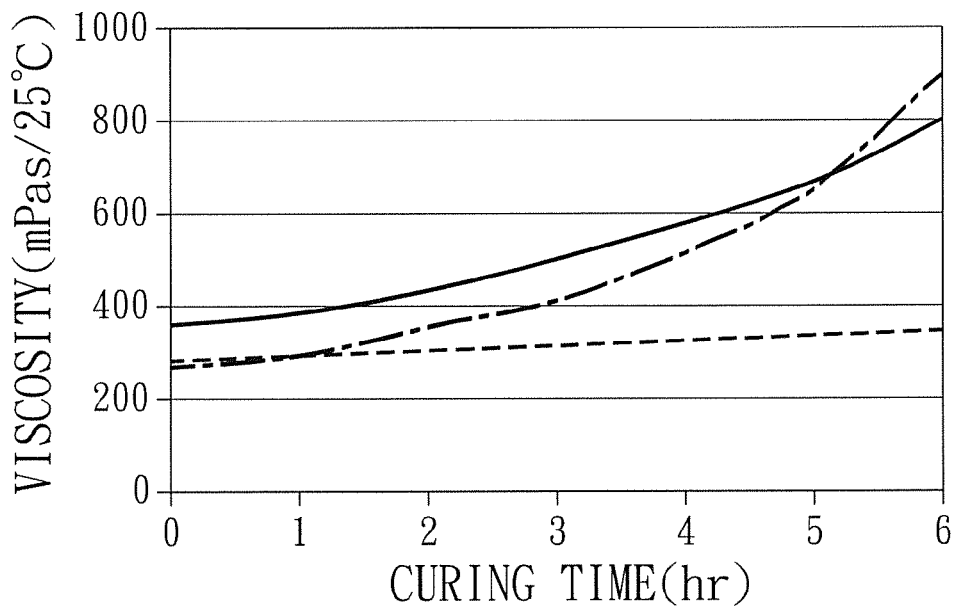
FIG. 4 is a plot of viscosity versus curing time for different compositions of an adhesive material.

Taking for example different compositions of epoxy (represented by three different line segments) with a same curing time of 3 hours, as shown in FIG. 4, the viscosities of the different epoxy compositions are apparently different. Hence, by selecting a suitable viscosity of the adhesive material, the bonding force (F1) between the cover body 4 and the frame 3 can be controlled to be smaller than the bonding force (F2) between the frame 3 and the substrate 2, so that $$\left(\frac{|F1-F2|}{F2}\times 100\%\right)$$

ranges from 25% to 100%.

B. Controlling the Curing Time of the Adhesive Material

Adhesive materials of the same type can have different hardness due to different curing times and thus produce different adhesive forces. Taking silicone as an example, with reference to FIG. 5, with a curing time (t1) of about 17 minutes, it has a hardness of 6 (which is equivalent to the first bonding force F1) as measured by Asker® Type C durometer, and with a curing time (t2) of about 26 minutes, it has a hardness of 10 (which is equivalent to the second bonding force F2) as measured by the Asker® Type C durometer. The percentage difference between the two bonding forces (F1, F2) is:

$$\left(\frac{|F1-F2|}{F2}\times 100\%\right)=40\%$$

Figure 5:
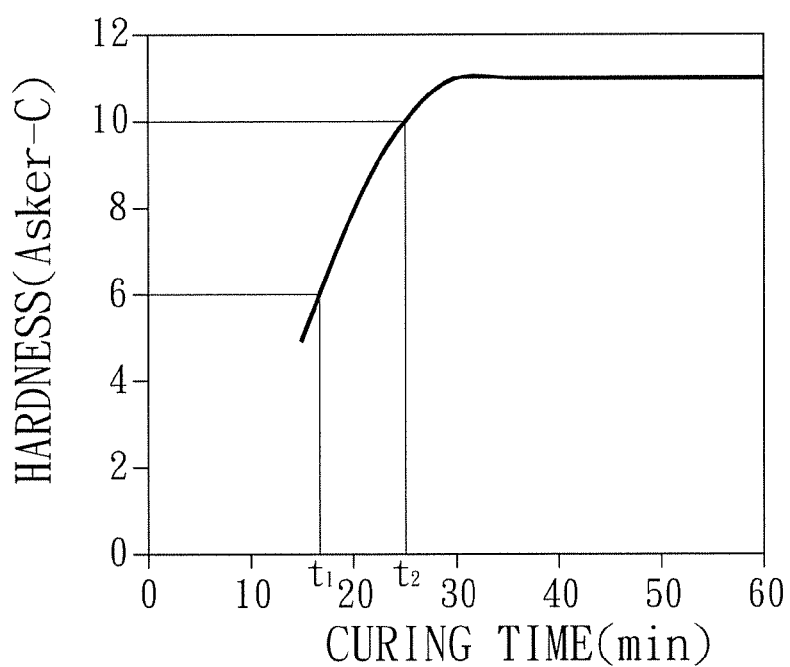
FIG. 5 is a plot of hardness versus curing time for the adhesive material having different curing times.

It is apparent that if the adhesive materials for adhering the cover body 4 and the frame 3 and for adhering the frame 3 and the substrate 2 are silicone, as shown in FIG. 5, and the adhesive material for adhering the cover body 4 and the frame 3 has the curing time (t1), and the adhesive material for adhering the frame 3 and the substrate 2 has the curing time (t2), the bonding force (F1) between the cover body 4 and the frame 3 is smaller than the bonding force (F2) between the frame 3 and the substrate 2 by 40%.

C. Weakening an Adhesive Force of the Adhesive Material

Aside from using different types of the adhesive materials or controlling the curing time of the adhesive material to obtain the required bonding forces, the adhesive force of the adhesive material may also be weakened by employing treatment, such as chemical treatment, high-temperature heat treatment, ultrasonic wave treatment, or ultraviolet light irradiation. That is, after the adhesive material for adhering the cover body 4 and the frame 3 is cured, one of the aforesaid treatment is used to lower the adhesive force of the adhesive material for adhering the cover body 4 and the frame 3.

In the chemical treatment, for example, acid liquid, alkaline liquid, or organic solvent (such as alcohol, acetone, rosin, hexane, toluene, isopropanol, etc.) is selected according to the property of the adhesive material to contact with the cured adhesive material so as to change the adhesive force of the adhesive material (i.e., to lower the bonding force between the cover body 4 and the frame 3).

High-temperature heat treatment uses the characteristics of the adhesive material, that is, the adhesive material is heated to above a certain temperature to destroy its behavior. For example, heating to above 100° C. will destroy the behavior of the acrylic and PU glue, and heating to above 200° C. will destroy numerous types of adhesive materials. As such, the bonding force between the cover body 4 and the frame 3 can be lowered.

The ultrasonic wave treatment employs acoustic cavitation generated by the ultrasonic wave to destroy the adhesive material, thereby lowering the bonding force between the cover body 4 and the frame 3.

In the ultraviolet light irradiation, the adhered cover body 4 and the frame 3 are radiated with ultraviolet light to destroy an organic chain in the adhesive material, so that the bonding force between the cover body 4 and the frame 3 can be lowered.

Figure 6:
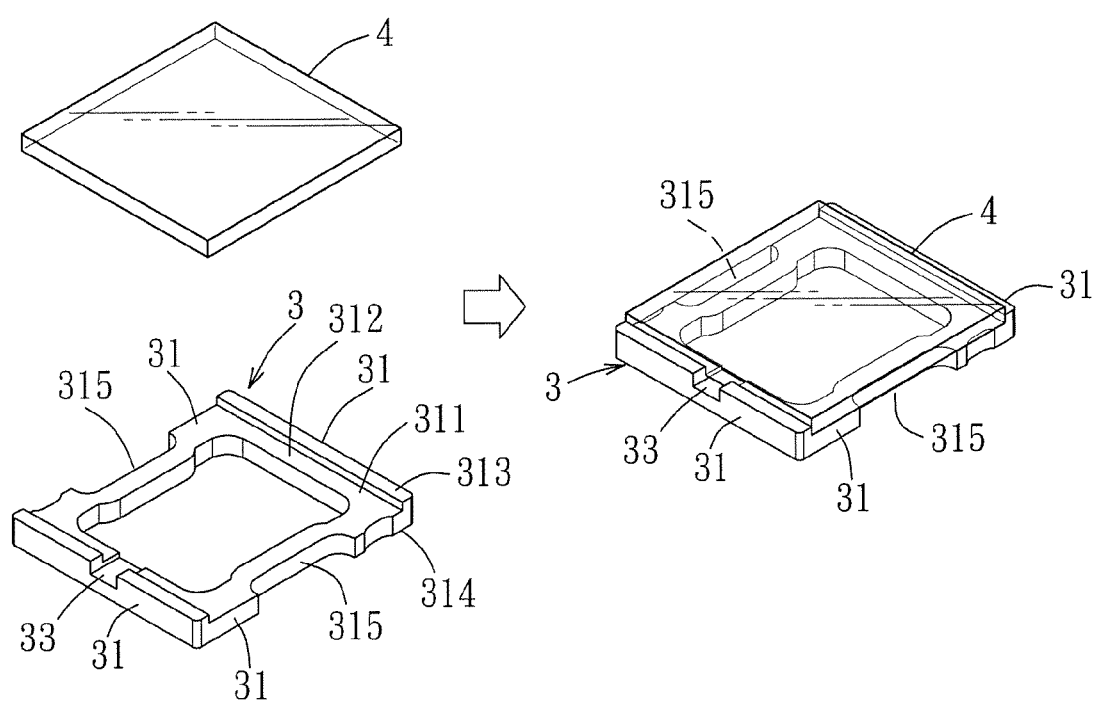
FIG. 6 is a flow diagram, illustrating partial steps involved in the method for manufacturing the lighting device according to a second preferred embodiment of the present invention.

Referring to FIG. 6, the lighting device 10 and the method for manufacturing the same according to a second preferred embodiment of the present invention are similar to that described in the first preferred embodiment. The difference between the first and second preferred embodiments resides in the structure of the frame 3. FIG. 6 illustrates only the frame 3 and the cover body 4, and the other components are omitted. In this embodiment, the outer sides of one pair of the opposite frame sections 31 of the frame 3 are provided respectively with cutout portions 315 located at central regions of the respective frame sections 31. Through the additional spaces provided by the cutout portions 315, separation of the cover body 4 from the frame 3 can be further facilitated. Moreover, in this embodiment, the limiting groove 311 is defined by the top surfaces 312 and the flanges 313 of the other pair of the opposite frame sections 31. The cover body 4 can be similarly limited within the limiting groove 311.

Below are laboratory experiments to further describe the present invention. Each laboratory experiment uses different first and second bonding forces (E1, F2) to observe if the cover body 4 itself can be removed easily, and the effect of the difference in the bonding forces relative to the difficult removal of the cover body 4 and the completeness of the frame 3 after removal of the cover body 4 therefrom. The experiments are arranged as shown in List 1, wherein:

F1 represents the first bonding force for bonding the cover body 4 and the frame 3;

F2 represents the second bonding force for bonding the frame 3 and the substrate 2;

Percentage difference is obtained by calculations using the aforesaid correlation $$\left(\frac{|F1-F2|}{F2} \times 100\%\right);$$

"A" represents coherency of the cover body 4 and the frame 3, "O" means good coherency, "X" means the cover body 4 falls off prior to removal from the frame 3; and "B" represents completeness of the frame 3 after removal of the cover body 4 therefrom, "O" means the frame 3 is completely adhered to the substrate 2, "X" means the frame 3 is separated from the substrate 2.

List 1

| Experiment No. | F1 (kgf/cm²) | F2 (kgf/cm²) | Percentage difference | A | B |
|---|---|---|---|---|---|
| 1 | 10 | 12 | 16.7% | O | X |
| 2 | 15 | 20 | 25.0% | O | O |
| 3 | 5 | 100 | 95.0% | X | O |
| 4 | 15 | 200 | 92.5% | O | O |

In Experiment No. 1, because the difference between F1 and F2 is small, the force exerted to separate the cover body 4 from the frame 3 will destroy the coherency of the frame 3 and the substrate 2, resulting in breaking away of the frame 3 from the substrate 2.

In Experiment No. 3, although the difference between F1 and F2 is large so that the force exerted to remove the cover body 4 from the frame 3 will not destroy the coherency of the frame 3 and the substrate 2. However, because the bonding force (F1) between the cover body 4 and the frame 3 is weak, the cover body 4 is likely to fall off during singulation of the lighting devices or during a downstream end in the making of the light source system, thereby losing the protective function of the cover body 4.

In Experiment Nos. 2 and 4, the difference between F1 and F2 is proper such that when the cover body 4 is removed, the coherency of the frame 3 and the substrate 2 is not destroyed. That is, complete coherency of the frame 3 and the substrate 2 can be maintained. Further, the cover body 4 and the frame 3 have sufficient bonding force to overcome the vibration or impact of the subsequent manufacturing processes, so that the protective function of the cover body 4 can be attained. Through this configuration, after the cover body 4 is removed in the subsequent application of the light source system, that is, the lighting device 10 assembled on the microprojector has no cover body 4, the frame 3 can be used to protect the conducting wires 11. The conducting wires 11 interconnect the lighting chips 1 from being contacted because the frame 3 has a height higher than the conducting wires 11 and has a function of limiting height. Moreover, the light source system can have a small Etendue.

From the aforesaid description, because the cover body 4 can be bonded removably to the frame 3, the lighting device 10 of the present invention can make use of the cover body 4 and the frame 3 to protect the lighting chip 1 and the conducting wires 11, and can make use of the frame 3 to protect the conducting wires 11 from being contacted when the cover body 4 is removed in the subsequent application of the light source system. Further, the light source system can have a small Etendue. Hence, the objects of the present invention can be realized.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

I claim:

1. A method for manufacturing a lighting device, comprising:
   preparing a substrate having at least one lighting chip, a frame for surrounding the lighting chip, and a cover body for covering one side of the frame;
   bonding the frame and the substrate so that the lighting chip is located within a region surrounded by the frame; and
   bonding the cover body and the frame so that the cover body and the frame cooperatively define a receptacle to cover the lighting chip;
   wherein, a bonding force between the cover body and the frame is configured to be smaller than a bonding force between the frame and the substrate.

2. The method of claim 1, wherein the bonding force between the cover body and the frame is defined as a first bonding force F1, and the bonding force between the frame and the substrate is defined as a second bonding force F2, and wherein F1 and F2 satisfy a first correlation:

$$25\% < \left(\frac{|F1-F2|}{F2} \times 100\%\right) < 100\%$$

and a second correlation:

$$F1 \leq 5 \text{ kgf/cm}^2.$$

3. The method of claim 1, further comprising removing the cover body from the frame.

4. The method of claim 2, wherein the cover body and the frame are bonded by using an adhesive material, the first bonding force being determined according to a bonding area or an adhesive force of the adhesive material for adhering the cover body and the frame.

5. The method of claim 2, wherein the frame and the substrate are bonded by using a soldering material or an adhesive material.

6. The method of claim 2, wherein the bonding of the frame and the substrate and the bonding of the cover body and the frame are both achieved by using an adhesive material.

7. The method of claim 2, wherein after the cover body and the frame are bonded, the bonding force between the cover body and the frame is weakened through one of the following methods: chemical treatment, high-temperature heat treatment, ultrasonic wave treatment, or ultraviolet light irradiation.

8. The method of claim 2, wherein the percentage of the difference between the first and second bonding forces based on the second bonding force is in the range of 40% to 90%.

9. The method of claim 4, wherein the adhesive force of the adhesive material for adhering the cover body and the frame is determined according to one of the following methods: selecting the adhesive material with a specific viscosity, controlling a curing time of the adhesive material, or weakening an adhesive force of the adhesive material using chemical treatment, high-temperature heat treatment, ultrasonic wave treatment, or ultraviolet light irradiation.

10. The method of claim 6, wherein the adhesive material for adhering the cover body and the frame has a bonding area smaller than a bonding area of the adhesive material for adhering the frame and the substrate.

11. The method of claim 6, wherein the adhesive material for adhering the cover body and the frame has an adhesive force smaller than an adhesive force of the adhesive material for adhering the frame and the substrate.

12. A lighting device comprising:
a substrate;
at least one lighting chip mounted on the substrate;
a frame disposed on the substrate and surrounding the lighting chip, the frame having opposite top and bottom surfaces, the bottom surface being bonded to the substrate; and
a cover body bonded removably to the top surface of the frame and cooperating with the frame to cover the lighting chip;
wherein a first bonding force defined as a force between the cover body and the frame, a second bonding force defined as a force between the frame and the substrate, said first bonding force is smaller than said second bonding force.

13. The lighting device of claim 12, wherein a bonding area between the cover body and the frame is smaller than a bonding area between the frame and the substrate.

14. The lighting device of claim 12, wherein the percentage of the difference between the first and second bonding forces based on the second bonding force is in the range of 40% to 90%.

15. The lighting device of claim 12, wherein the frame further has a notch indented downward from the top surface.

16. The lighting device of claim 12, wherein the frame defines a frame opening, and includes two opposite frame sections disposed respectively on two sides of the frame opening, each of the frame sections having an inner side facing the frame opening, and an outer side opposite to the inner side and provided with a cutout portion.

17. The lighting device of claim 12, wherein the frame includes at least one frame section to define a frame opening, the frame section having opposite top and bottom surfaces, and a flange projecting upward from the top surface of the frame section, the flange and the top surfaces of the frame section cooperatively defining a limiting groove for receiving and positioning the cover body on the frame.

18. The lighting device of claim 16, wherein the cutout portion is located at a central region of a respective one of the frame sections.

19. A lighting device comprising:
a substrate;
at least one lighting chip mounted on the substrate;
a frame disposed on the substrate and surrounding the lighting chip, the frame having opposite top and bottom surfaces, the bottom surface being bonded to the substrate; and
a cover body bonded removably to the top surface of the frame and cooperating with the frame to cover the lighting chip;
wherein the bonding force between the cover body and the frame is defined as a first bonding force F1, and the bonding force between said frame and said substrate is defined as a second bonding force F2, and wherein F1 and F2 satisfy a first correlation:

$$25\% < \left(\frac{|F1 - F2|}{F2} \times 100\%\right) < 100\%$$

and a second correlation:

$$F1 \leq 5 \text{ kgf/cm}^2.$$

20. The lighting device of claim 19, wherein the frame further has a notch indented downward from the top surface.

21. The lighting device of claim 19, wherein the frame defines a frame opening, and includes two opposite frame sections disposed respectively on two sides of the frame opening, each of the frame sections having an inner side facing the frame opening, and an outer side opposite to the inner side and provided with a cutout portion.

22. The lighting device of claim 19, wherein the frame includes at least one frame section to define a frame opening, the frame section having opposite top and bottom surfaces, and a flange projecting upward from the top surface of the frame section, the flange and the top surfaces of the frame section cooperatively defining a limiting groove for receiving and positioning the cover body on the frame.

23. The lighting device of claim 21, wherein the cutout portion is located at a central region of a respective one of the frame sections.

* * * * *